(12) United States Patent
Thiagarajan et al.

(10) Patent No.: US 10,761,162 B2
(45) Date of Patent: Sep. 1, 2020

(54) GRADIENT COIL COOLING SYSTEMS

(71) Applicant: General Electric Company, Schenectady, NY (US)

(72) Inventors: Naveenan Thiagarajan, Schenectady, NY (US); Derek Allan Seeber, Florence, SC (US); Eric George Budesheim, Wynantskill, NY (US); Charles Critcher, Florence, SC (US); Dominic Michael Graziani, Arvada, CO (US)

(73) Assignee: General Electric Company, Schenectady, NY (US)

( * ) Notice: Subject to any disclaimer, the term of this patent is extended or adjusted under 35 U.S.C. 154(b) by 107 days.

(21) Appl. No.: 16/134,060

(22) Filed: Sep. 18, 2018

(65) Prior Publication Data

US 2020/0088818 A1 Mar. 19, 2020

(51) Int. Cl.
*G01R 33/385* (2006.01)
*G01R 33/421* (2006.01)

(52) U.S. Cl.
CPC ..... *G01R 33/3856* (2013.01); *G01R 33/4215* (2013.01)

(58) Field of Classification Search
CPC .......... G01R 33/3856; G01R 33/4215
See application file for complete search history.

(56) References Cited

U.S. PATENT DOCUMENTS

| | | |
|---|---|---|
| 2,385,542 A | 11/1945 | Rippingille |
| 2,695,368 A | 11/1954 | Kilbourne |
| 4,516,404 A | 5/1985 | Laskaris |
| 5,414,399 A | 5/1995 | Breneman et al. |
| 5,554,929 A | 9/1996 | Doty et al. |
| 6,011,394 A | 1/2000 | Petropoulos et al. |
| 6,111,412 A | 8/2000 | Boemmel et al. |
| 6,154,110 A | 11/2000 | Takeshima |
| 6,236,207 B1 | 5/2001 | Arz et al. |
| 6,552,545 B2 | 4/2003 | Kaindl et al. |
| 6,741,152 B1 | 5/2004 | Arz et al. |
| 6,774,631 B2 | 8/2004 | Heid |
| 6,825,664 B2 | 11/2004 | Kwok et al. |
| 6,909,283 B2 | 6/2005 | Emeric et al. |
| 6,980,001 B2 | 12/2005 | Paley et al. |
| 7,015,692 B2 | 3/2006 | Clarke et al. |
| 7,135,863 B2 | 11/2006 | Arik et al. |
| 7,489,131 B2 | 2/2009 | Lvovsky |
| 8,593,146 B2 | 11/2013 | Gao et al. |

(Continued)

FOREIGN PATENT DOCUMENTS

| | | |
|---|---|---|
| EP | 1650557 B1 | 7/2013 |
| WO | 2014034467 A1 | 3/2014 |
| WO | 2014133185 A1 | 9/2014 |

*Primary Examiner* — Akm Zakaria

(74) *Attorney, Agent, or Firm* — The Small Patent Law Group LLC; Dean D. Small

(57) ABSTRACT

A magnetic resonance imaging (MRI) coil system is provided that includes a gradient coil and a flow inlet. The gradient coil includes a flow channel passing therethrough. The gradient coil defines an eye and an end. The eye is disposed proximate the center of the gradient coil. The flow inlet is disposed along the gradient coil between the eye and the end. Cooling fluid is provided to the gradient coil via the flow inlet, and removed from the gradient coil via the eye and the end.

20 Claims, 7 Drawing Sheets

(56) References Cited

U.S. PATENT DOCUMENTS

| | | |
|---|---|---|
| 8,963,548 B2 | 2/2015 | Kimmlingen et al. |
| 2001/0019266 A1 | 9/2001 | Nerreter |
| 2002/0148604 A1 | 10/2002 | Emeric et al. |
| 2003/0010485 A1 | 1/2003 | Goldman et al. |
| 2003/0015316 A1 | 1/2003 | Burkay |
| 2005/0093543 A1 | 5/2005 | Arik et al. |
| 2005/0179435 A1* | 8/2005 | Coughlin ............ G01R 33/3856 324/318 |
| 2009/0021255 A1* | 1/2009 | DeVries ............. G01R 33/3403 324/318 |
| 2013/0229183 A1 | 9/2013 | Kimmlingen et al. |
| 2013/0241558 A1 | 9/2013 | Schuster et al. |
| 2015/0338482 A1 | 11/2015 | Sakakura et al. |
| 2016/0069971 A1* | 3/2016 | McNulty ............ G01R 33/3852 165/80.2 |
| 2017/0219668 A1 | 8/2017 | Thiagarajan et al. |
| 2018/0071348 A1* | 3/2018 | Conner ................... C12N 7/00 |

* cited by examiner

GRADIENT COIL COOLING SYSTEMS

BACKGROUND OF THE INVENTION

The subject matter disclosed herein relates generally to apparatus and methods for cooling of gradient, shield, and/or other coils of an MRI system.

Hollow MRI gradient coil architectures may be utilized to allow for internal cooling, resulting in higher gain compared to stranded solid conductors with separate cooling circuits at different or the same radii. However, hollow gradient coils may lead to a relatively large pressure drop due to the length of the coils and relative narrowness of the passageways, and/or lead to a higher electrical resistance to a smaller cross-sectional area (e.g., with some of the area having an open passageway instead of solid conductor).

BRIEF DESCRIPTION OF THE INVENTION

In one example embodiment, a magnetic resonance imaging (MRI) coil system is provided that includes a gradient coil and a flow inlet. The gradient coil includes a flow channel passing therethrough. The gradient coil defines an eye and an end. The flow inlet is disposed along the gradient coil between the eye and the end. Cooling fluid is provided to the gradient coil via the flow inlet, and removed from the gradient coil via the eye and the end.

In another example embodiment, a magnetic resonance imaging (MRI) coil system is provided that includes at least one gradient coil and a central manifold. The gradient coil includes a flow channel passing therethrough, and defines an eye and an end. The central manifold is disposed axially inward of the end of the gradient coil. The central manifold includes a manifold inlet to receive a fluid supply, and at least one fluid outlet in fluid communication with the flow channel of the gradient coil.

DETAILED DESCRIPTION OF THE INVENTION

Figure 1:
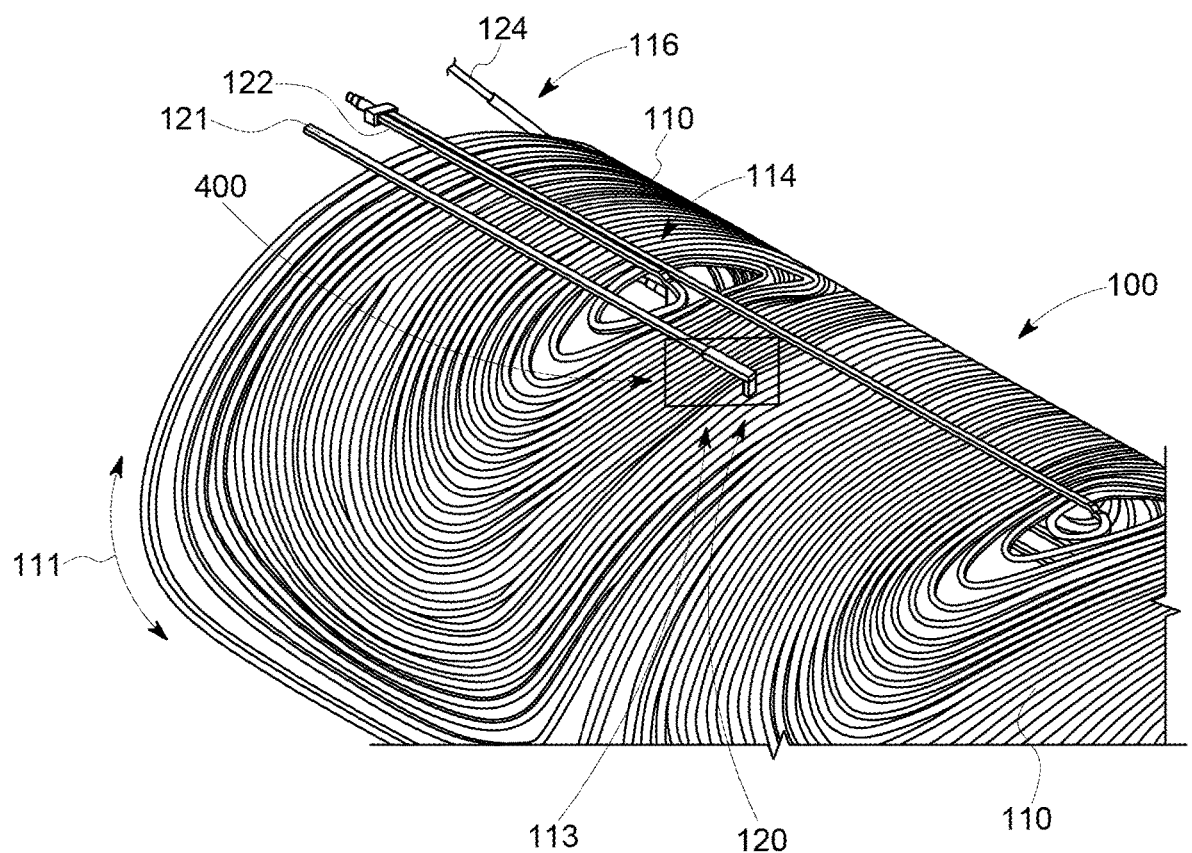
FIG. 1 provides a perspective schematic view of a coil system in accordance with various embodiments.

The following detailed description of certain embodiments will be better understood when read in conjunction with the appended drawings. To the extent that the figures illustrate diagrams of the functional blocks of various embodiments, the functional blocks are not necessarily indicative of the division between hardware. It should be understood that the various embodiments are not limited to the arrangements and instrumentality shown in the drawings.

As used herein, an element or step recited in the singular and preceded with the word "a" or "an" should be understood as not excluding plural of said elements or steps, unless such exclusion is explicitly stated. Furthermore, references to "one embodiment" of are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

Various embodiments provide improved gradient coil cooling. For example, various embodiments provide branched hollow conductor coil design (e.g., including two branches extending from a flow inlet to opposed ends of a coil), leading to a lower pressure drop and/or lower DC resistance. With the branched designs disclosed herein, a finger print coil pattern may remain as a single electrical circuit, while being divided into two (or more) flow paths or flow branches to reduce the pressure drop. The reduction in pressure drop may be utilized, in various embodiments, to increase coil cross-section, thereby leading to a lower electrical resistance. For example, in various embodiments, up to 60% lower pressure drop in addition to 20% lower electrical resistance may be achieved relative to designs using a single flow path from end-to-end of a coil. Accordingly, lower cooling costs and/or lower electrical costs may be achieved, and/or a reduced footprint may be provided by utilizing smaller cross-section coils.

In various embodiments, branching of the flow pattern along a gradient coil is provided. For example, a flow inlet is formed at the middle (or other intermediate point) of the coil pattern, rather than the ends. Accordingly, the flow is branched or split in two—a first branch toward a coil eye (or other end, depending on coil shape), and a second branch toward the coil outer turns (or other end, depending on coil shape). Fluid from the two separate flow paths is collected at the coil ends, leading to a reduced pressure drop to the smaller flow path length.

In various embodiments, coupling of a supply line to a flow inlet disposed at an intermediate point along the length of a gradient coil may be accomplished using a flow splitter or other fitting that is attached to a face of a gradient coil by, for example, threaded fastening (with or without thread lockers), permanent bonding using adhesives, brazing using fillers, or welding, among others. An opening in the face of the coil may be provided by drilling, or drilling and tapping to allow a threaded fitting. An opposite end of the flow splitter may be connected to a fluid tube, for example, by a barbed fitting, threaded fitting, compression fitting, permanent bonding using adhesives, or brazing/welding to a metal tube, among others. In some embodiments, a hollow conductor may be broken, bent 90 degrees and attached with a fitting for flow. The fitting may also provide an electrical connection between such broken circuits.

It may further be noted that gradient coil configurations disclosed herein may be used in all axes and both primary and shield layers. Further, where flow splitting may not be possible or practical due to geometric limitations, pressure drop and/or electrical resistance improvements may be accomplished using stranded (e.g., non-branched, or with a single flow path flowing from one end to the other end) hollow conductors of shortened length disposed side-by-side or parallel, with the adjacent conductors held next to each other throughout multiple turns of the coil. It may be noted that in various embodiments the conductors may not be shortened. Because the two flow paths are side-by-side, twice the number of branches are provided relative to a single flow path, leading to a lower pressure drop.

As the number of inlets and/or outlets on the gradient coil increases due to the use of the flow inlets discussed herein, in various embodiments the number of external connections to a gradient coil (or coils) may be reduced by using a central manifold. Use of the central manifold reduces the costs of external manifolds and simplifies plumbing connections to the gradient coil (or coils).

A technical embodiment of various embodiments includes improved cooling of gradient and/or shield coils of MRI systems. A technical embodiment of various embodiments includes improved pressure drop and/or electrical characteristics for hollow MRI coils.

FIG. 1 provides a perspective view of a magnetic resonance imaging (MRI) coil system 100 formed in accordance with various embodiments. The coil system 100 is configured for use in acquiring MRI imaging information, and includes one or more gradient coils for use in connection with an MRI imaging system (see, e.g., FIG. 10 and related discussion for additional background and details regarding an example MRI imaging system). As seen in FIG. 1, the depicted example coil system 100 includes a gradient coil 110 and a flow inlet 120. As the gradient coil 110 is utilized in an imaging process and current passes through the gradient coil 110, the gradient coil 110 tends to heat. Generally, the flow inlet 120 is utilized to provide cooling fluid for distribution along the gradient coil 110.

The gradient coil 110 includes a flow channel 112 (see FIGS. 2 and 3 for cross-sectional views including example flow channels 112) that passes therethrough (e.g., along an entire length of the gradient coil 110). The depicted gradient coil 110 (which may be made of, for example, copper, or as another example, aluminum) defines an eye 114 and an end 116. Generally, the gradient coil 110 is spirally wrapped around the eye 114 and terminates at the end 116. The gradient coil 110 is disposed on a cylindrical substrate for positioning around a bore into which a subject to be imaged is placed. It may be noted that two gradient coils 110 are depicted side by side along an axial direction in FIG. 1. It may be noted that, in various embodiments, a single axis of a gradient coil assembly may contain a mirrored copy of two side-by side gradient coils. It may further be noted that one flow inlet 120 per coil is shown in FIG. 1; however, additional flow inlets 120 may be provided for each coil to provide additional fluid paths or branches, and along with flow inlets 120 disposed at intermediate lengths along a coil (e.g., interposed between the eye and the end), fluid outlets may also be disposed at intermediate lengths along the coil to provide additional fluid paths. It may be noted that, in various embodiments, 4 gradient boards may be used to make a gradient layer. Each gradient board may have an eye and an end.

It may be noted that the eye 114 is an example of an end of the gradient coil 110, and that other shapes of coils (e.g., not spirally shaped about an eye) may be employed alternatively or additionally to coils that spiral about an eye. For example, a Z-gradient coil may not be spirally wound, but instead define a cylinder. For such a coil, the flow inlet 112 may be placed at an intermediate point between two ends defined by the cylinder shape of the coil.

Figure 2:
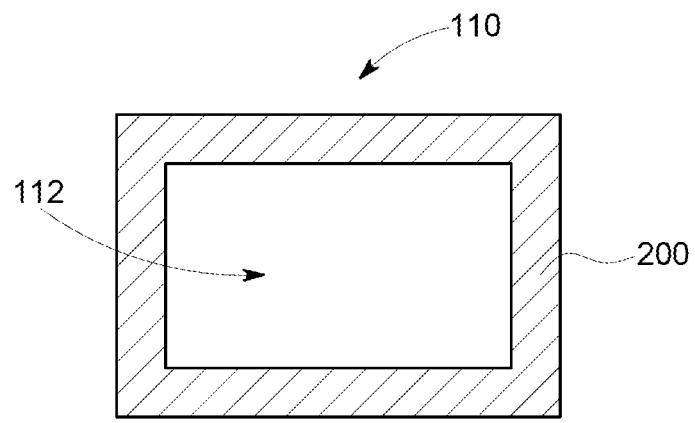
FIG. 2 provides a cross-sectional view of a flow channel in accordance with various embodiments.

In some embodiments, the flow channel 112 may be bounded by conductive portions of the gradient coil 110. For example, FIG. 2 provides a sectional view of an example gradient coil 110 that includes a conductive shell 200. The conductive shell 200 is disposed about and defines the flow channel 112. For example, the conductive shell 200 may be formed from solid metal (e.g., copper) disposed about a central opening passing along the length of the conductive shell 200 to define the flow channel 112.

Figure 3:
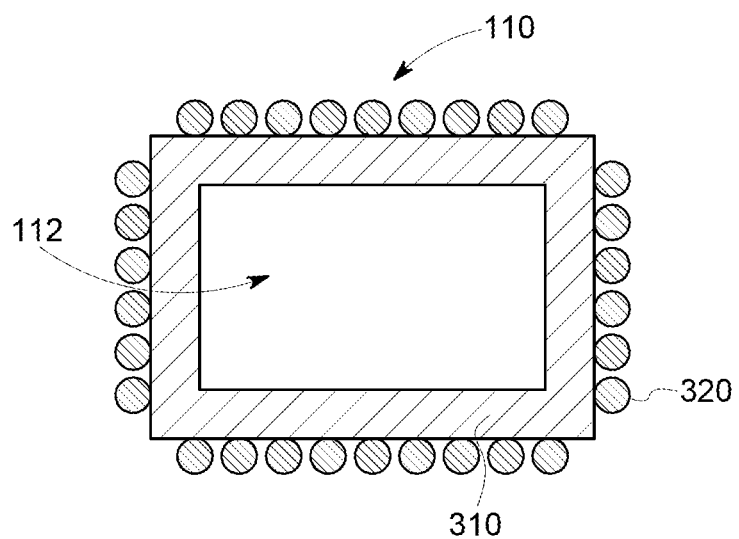
FIG. 3 provides a cross-sectional view of a flow channel in accordance with various embodiments.

In some embodiments, the flow channel 112 may be bounded by a first structure with a conductive portion of the gradient coil 110 disposed outward of the first structure. For example, FIG. 3 provides a sectional view of an example gradient coil 110 that includes a cooling tube 310 and conductive wire 320. The conductive wire 320 (e.g., Litz wire) is disposed about the cooling tube 310. The interior of the cooling tube 310 defines the flow channel 112. It may be noted that while the tube, shell, and channel of FIGS. 2 and 3 are shown in the example illustrations as having a rectangular shape, other shapes may be employed in alternative embodiments. It may further be noted that the cooling tube 310 may be made of a conductive material, such as, by way of example and not limitation, copper.

Returning to FIG. 1, the depicted flow inlet 120 is disposed along the gradient coil 110 between the eye 114 and the end 116. Cooling fluid is provided to the gradient coil 110 via the flow inlet 120, and removed from the gradient coil 110 via the eye 114 and the end 116. For example, in the illustrated embodiment, a fluid supply line 121 is coupled to the flow inlet 120 and provides cooling fluid from a fluid supply. The fluid supply line 121 is thus in fluid communication with the flow channel 112 via the flow inlet 120. An eye exit line 122 is in fluid communication with the eye 114, and provides an exit path for fluid passing through the eye 114. Similarly, an end exit line 124 is in fluid communication with the end 116, and provides an exit path for fluid passing through the end 116. It may be noted that one or more manifolds may be used to manage fluid supply and/or removal from the gradient coil 110 additionally or alternatively to the depicted supply and exit lines.

Accordingly, instead of travelling all the way between the eye 114 and the end 116, fluid through the gradient coil 110 travels along two shorter paths: from the flow inlet 120 through the eye 114, and from the flow inlet 120 through the end 116. As a result, compared to approaches where flow enters the eye 114 and exits the end 116, the length of travel and, accordingly pressure drop, of the fluid is reduced by having the flow enter at the flow inlet 120 and exit at the eye 114 and end 116. In some embodiments, the improvement in pressure drop gains may be balanced with alterations to electrical properties of the gradient coil. For example, the improved pressure drop may be beneficially utilized to facilitate use of a relatively smaller flow path cross-section, thereby allowing for relatively more conductive material in the cross-section of the gradient coil for a given size gradient coil.

For example, the distance travelled by the fluid may be reduced by about half by utilizing the flow inlet 120. In the illustrated embodiment, for example, the gradient coil 110 defines a length 111 having an iso-center 113. The iso-center 113 is disposed at the midway point of the length 111. For example, if the length 111 along the gradient coil 110 extends 100 meters from the eye 114 to the end 116, the iso-center 113 is at 50 meters from the eye 114 (and also 50 meters from the end 116). In various embodiments, the flow inlet 120 is disposed substantially at the iso-center 113. It may be noted that substantially at the iso-center 113 as used herein may be understood to include lengths within 5% of the overall length 111 from the iso-center 113. By way of example, for a coil having an overall length of 100 meters and an iso-center 50 meters from the eye, locations between 45 and 55 meters from the eye would be understood as being substantially at the iso-center. It may be noted that the sizes referenced above are provided by way of example for illustrative purposes, and that other sizes and lengths of coils may be employed in various alternate embodiments.

Figure 4:
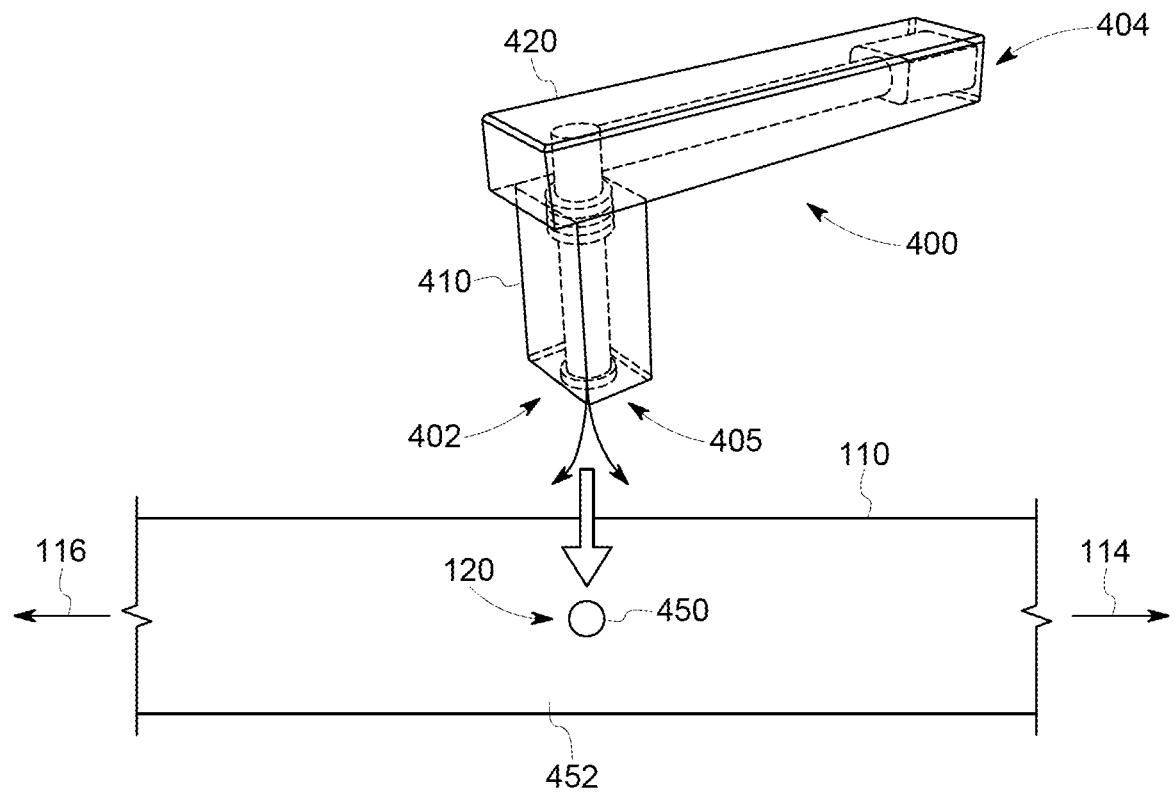
FIG. 4 provides perspective view of an inlet assembly in accordance with various embodiments FIG. 5 provides an end view of a shield coil assembly in accordance with various embodiments.

It may be noted that the flow inlet 120 may be configured as or include a hole or opening in the coil, and may include fittings configured to couple a fluid supply line to the gradient coil. In various embodiments, the coil system 100 includes an inlet assembly configured to couple the fluid supply line 121 to the flow inlet 120. FIG. 4 provides a perspective view of an inlet assembly 400 in accordance with various embodiments. As seen in FIG. 4, the inlet assembly 400 is coupled to the flow inlet 120. The inlet assembly 400 has a first end 402 that is configured to couple to the flow inlet 120, and has a second end 404 configured to couple to the fluid supply line 121. The inlet assembly 400 in various embodiments provides for reliable convenient coupling between the fluid supply and the flow channel 112, and may have a relatively low profile to provide for placement in locations with restricted access. In the illustrated embodiment, the first end 402 couples to a hole 450 that extends through an exterior 452 of the gradient coil 110 to define the flow inlet 120. The first end 402 in various embodiments may be epoxied to the gradient coil 110 with a flow passageway 405 of the inlet assembly aligned with the hole 450 to allow the passage of fluid through the inlet assembly 400 and into the hole 450. In other embodiments, the first end 402 may be attached to the gradient coil 110 using one or more of threads, soldering, brazing, or the like. As schematically depicted in FIG. 4, the flow out of the first end 402 is split into two directions—one flowing toward the eye 114 and one flowing toward the end 116. In some embodiments not using a coil with an eye, the flow out of the first end 402 into the coil is directed into two opposite directions toward respective opposite ends of the coil.

In various embodiments, the inlet assembly 400 may be composed of individual pieces joined together. For example, in the embodiment depicted in FIG. 4, the inlet assembly 400 includes a coil end portion 410 and a supply end portion 420. The coil end portion 410 extends perpendicularly from the supply end portion 420. The arrangement of FIG. 4 provides for a low profile for access to a hard to reach location. The coil end portion 410 and supply end portion 420 may be joined, for example, via a threaded connection and then permanently bonded by epoxy in various embodiments. The inlet assembly 400 may be made from an insulated material to prevent current flow from the gradient coil 110 through the inlet assembly, or may have an insulative break associated with the inlet assembly 400 (e.g., be joined to an insulated manifold, or have an insulated portion interposed between the second end 420 and a manifold or other supply point). Because the flow is split in different directions along the gradient coil as it exits from the inlet assembly 400, the inlet assembly 400 may also be referred to as a fluid splitter assembly.

Figure 5:
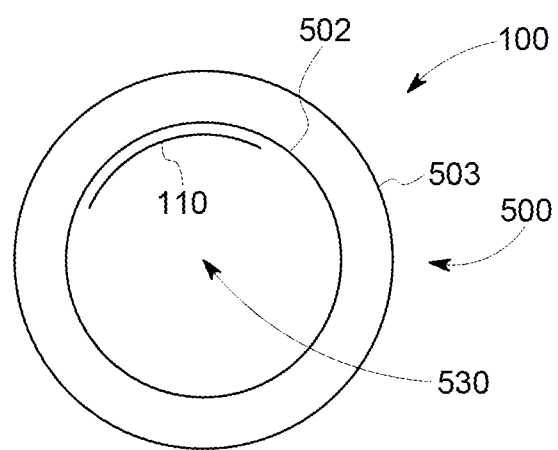
Figure 6:
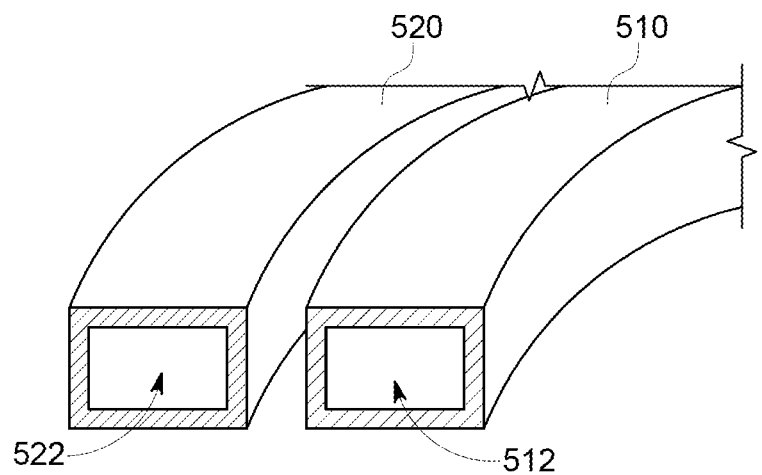
FIG. 6 provides a sectional view of aspects of the shield coil assembly of FIG. 5 in accordance with various embodiments.
Figure 7:
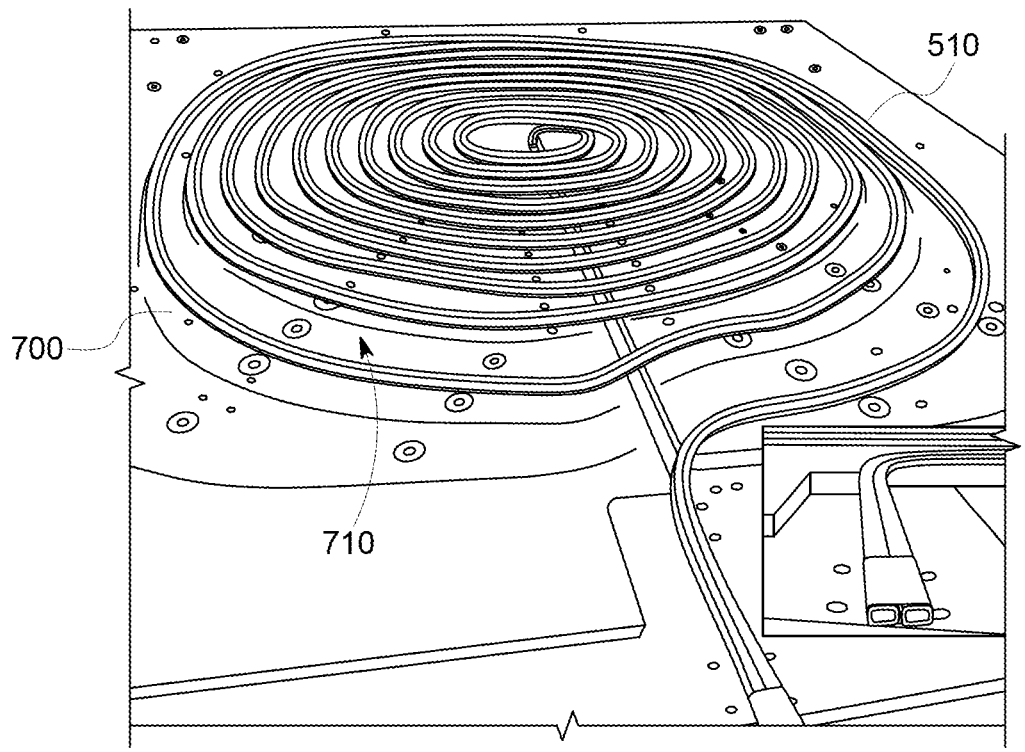
FIG. 7 provides a perspective view of aspects of the shield coil assembly of FIG. 5 in accordance with various embodiments.

It may be noted that the coil system 100 may also include one or more shield coils. For example, FIG. 5 depicts an end view of a coil system 100 including a shield coil assembly 500, FIG. 6 provides a sectional view of aspects of the shield coil assembly 500, and FIG. 7 provides a perspective view of additional aspects of the shield coil assembly 500. The example coil system 100 of FIG. 5 includes a primary gradient coil layer 502 and a shield gradient coil layer 503. The primary gradient coil layer 502 includes one or more gradient coils (e.g., gradient coil 110), and the shield gradient coil layer 503 includes the shield coil assembly 500. As seen in FIG. 5, the shield coil assembly 500 is disposed radially outward (e.g., with respect to a bore 530) of the primary gradient coil layer 502 (and, accordingly, radially outward of the gradient coil 110 disposed within the primary gradient coil layer 502). It may be noted that in various embodiments, there are 3 primary gradient coil axes—x, y, and z, with at least 1 set of primary gradient coil axes. Similarly, there may be three shield gradient coil axes.

Shield coils disposed within the shield gradient coil layer 503 may have cooling channels extending therethrough generally similar to flow channels passing through the gradient coil 110. However, due to space restrictions, it may difficult or impractical to access flow inlets disposed at intermediate points along a shield coil. Accordingly, multiple shield coils may be employed. As a result, for example, an eye-to-end fluid path may be utilized, but the pressure drop is reduced for flow throughout the coil. It may be noted that for various shield coil embodiments, pressure drop may be lowered by doubling (or otherwise multiplying) the number of parallel flow branches. For example, in the illustrated embodiment, the shield coil assembly 500 includes a first shield coil 510 and a second shield coil 520. The first shield coil 510 and the second shield coil 520 extend alongside each other and define a first shield coil flow channel 512 and a second shield coil flow channel 522 (see FIG. 6). Cooling fluid may be distributed through the flow channels 512, 522, for example, from an eye of a corresponding shield coil through the end of a shield coil. FIG. 7 shows a perspective view of the first shield coil 510 in place on a substrate 700 with a gap 710 between individual coils of the first shield coil 510. The second shield coil 520 (or portions thereof) may be disposed within the gap 710 to provide the side by side arrangement. It may be noted that, in various embodiments, the order of axes in the shield coils may be the same as the primary coil, and the shield coils may also be branched and utilize an inlet assembly as discussed herein.

Depending on the number of coils and number of corresponding flow inlets, a relatively large number of supply lines may be required to supply all of the flow inlets. However, there may be space restrictions on how many supply lines may be used. Accordingly, various embodiments utilize one or more central manifolds to manage the supply of fluid to the coils and/or the removal of fluid from the coils.

Figure 8:
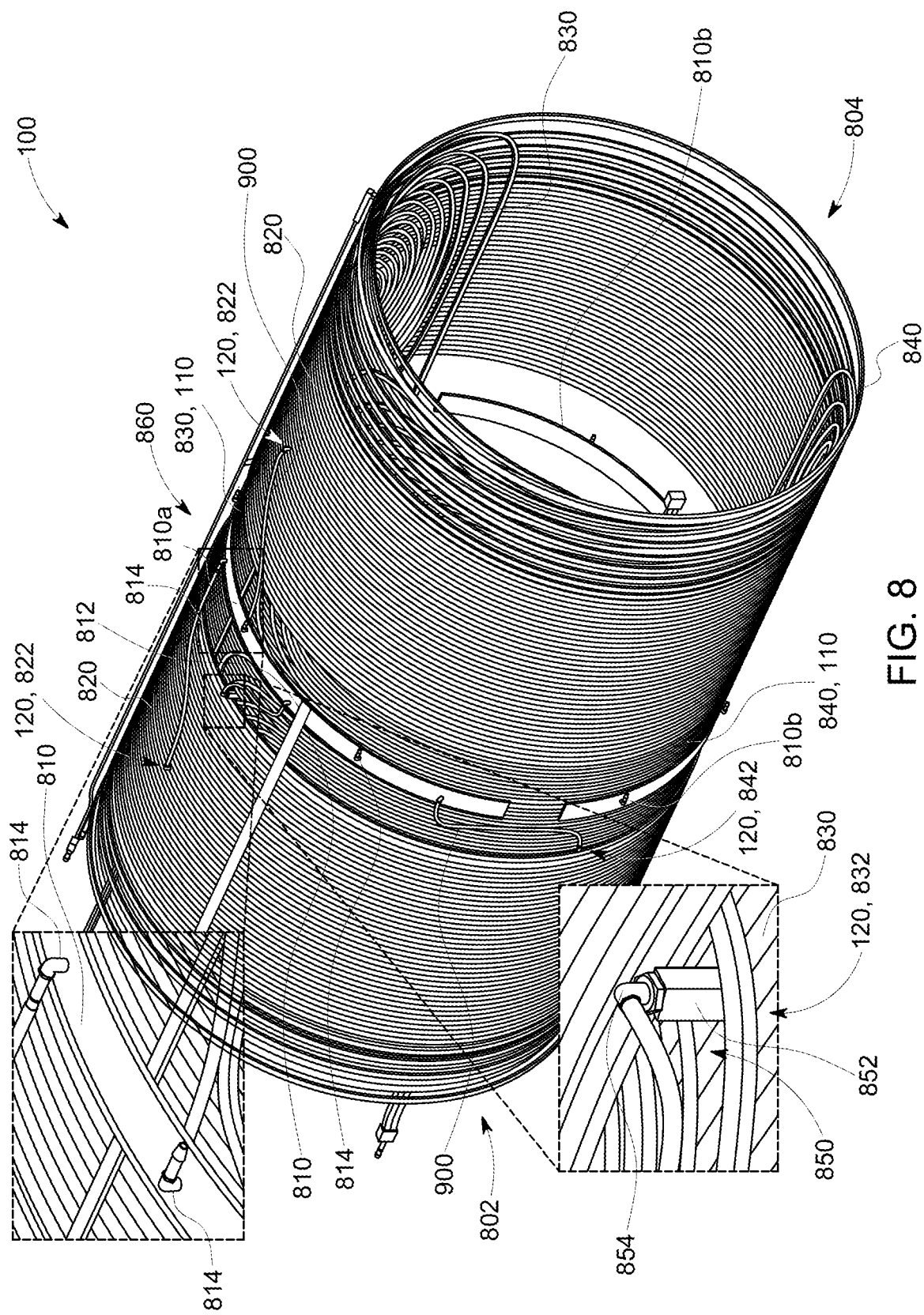
FIG. 8 provides a perspective view of a coil system in accordance with various embodiments.

For example, FIG. 8 provides a perspective view of a coil system 100 in accordance with various embodiments that includes a central manifold. It may be noted that the central manifold discussed in connection with FIG. 8 may be used in connection with systems including flow inlets disposed at intermediate lengths along a coil as discussed herein (e.g., in connection with FIGS. 1-7), or alternatively may be used in connection with different coil systems.

As seen in FIG. 8, the example coil system 100 includes a central manifold 810 that is disposed axially inward of the end of a gradient coil. For example, in FIG. 8, ends 802, 804 of one or more gradient coils are disposed on opposite ends of a cylindrical assembly including multiple gradient coils. As seen in FIG. 8, the central manifold 810 includes a manifold inlet 812 and fluid outlets 814. The manifold inlet 812 is configured to receive a fluid supply to be distributed by the central manifold 810, and each manifold inlet is configured to provide fluid to a corresponding flow inlet 120 of one of the gradient coils. Fluid supply lines 900 may be utilized to supply fluid from the central manifold 810 to the flow inlets 120. Accordingly, the fluid outlets 814 are in fluid communication with the flow channels 112 of the gradient coils 110, and may be used to provide fluid to the flow channels. Additionally or alternatively, a central manifold may be placed in fluid communication with eyes or ends of gradient coils and utilized for fluid removal from the gradient coils. It may be noted that 3 types of gradient coils are depicted in FIG. 8: Z-gradient coil 820 (having a generally cylindrical or helical shape shape), X-gradient coils 830 (having a spiral shape similar to gradient coil 110), and Y-gradient coils 840 (having a spiral shape similar to gradient coil 110, and offset by 90 degrees from the X-gradient coils 830).

It may be noted that in various embodiments, the central manifold 810 defines a substantially rectangular profile (e.g., rectangular crossosection). The use of a rectangular profile helps with radial space constraints in the gradient coil. The rectangular manifold 810 in various embodiments is made of a material selected to minimize or reduce eddy current generation, such as stainless steel.

It may be noted that multiple central manifolds may be utilized in various embodiments. For example, in the embodiment depicted in FIG. 8, plural central manifolds 810 are spaced radially about the bore 530 of the coil system 100. In addition to central manifold 810, the illustrated embodiment also includes central manifold 810a and central manifold 810b. (In the illustrated embodiment, the central manifold 810a and the central manifold 810b are similarly constructed.) It may be noted that central manifold 810a and central manifold 810b may be configured generally similarly to central manifold 810 and similarly include fluid lines extending between the fluid outlets and corresponding gradient coils as seen for central manifold 810. Different total numbers of central manifolds may be used in various embodiments. It may be noted that fluid lines 900 may be coupled to the inlet flows 820 via connections such as those shown in FIG. 4 or similar. An example connection shown in FIG. 8 includes a fluid splitter assembly 850 configured to fluidly couple the fluid outlet 814 (e.g., via supply line 900) with a flow channel 112 (e.g., via a corresponding flow inlet 120). The depicted fluid splitter assembly 850 includes a flow splitter 852 and a barbed connection 854. The flow splitter 852 may be generally similar, for example, to the coil end portion 420 of the inlet assembly 400 discussed herein.

Figure 9:
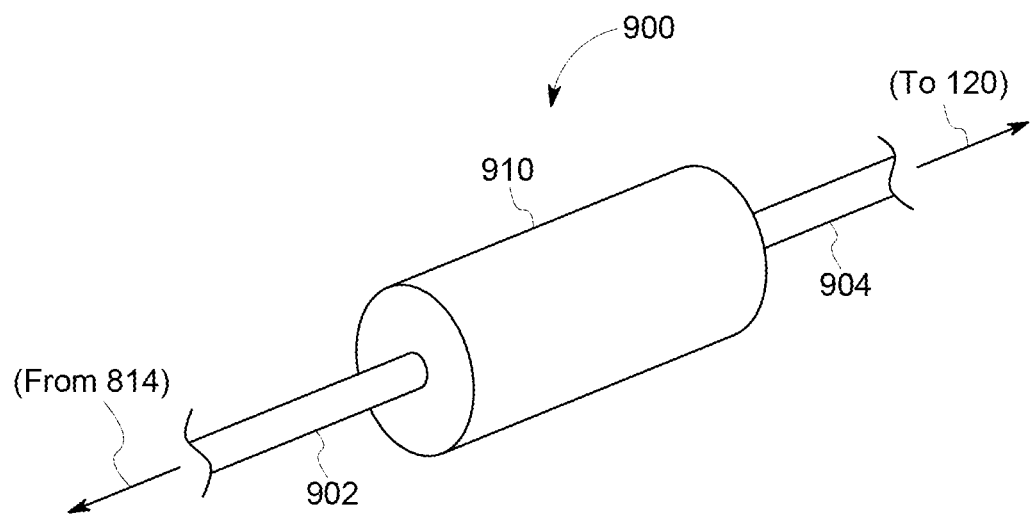
FIG. 9 provides a perspective view of an insulation break in accordance with various embodiments.

As seen in FIG. 8, supply lines 900 extend between and fluidly couple fluid outlets 814 of the manifold and flow inlets 120 of the gradient coils. It may be noted, however, that in various embodiments, an insulative break may be disposed along each of the supply lines 900, for example, to prevent current flow from the gradient coils to the central manifold 810 in embodiments where the central manifold 810 may be made from an electrically conductive material (e.g., metal). FIG. 9 provides a perspective view of an insulation break 910 formed in accordance with various embodiments. As seen in FIG. 9, the insulation break 910 is disposed along a supply line 900 that extends from a fluid outlet 814 of the central manifold 810 to a flow inlet 120 of the gradient coil 110. The supply line 900 is separated into two discontinuous portions (a manifold portion 902 oriented toward the central manifold 810, and a coil portion 904 oriented toward the flow inlet 120 being supplied by the supply line 900) that are joined by the insulation break 910. The insulation break 910, for example, may be formed as cylinder made of an electrically insulating material (e.g., ceramic) that couples to the manifold portion 902 and the coil portion 904 and allows flow from the manifold portion 902 to the coil portion 904. In some embodiments, the insulation break 910 may include a plastic piece with o-ring seals connecting two round tubes of metal to provide a break between the two metal tubes.

Returning to FIG. 8, as also discussed above, the depicted example coil system 100 includes a Z-gradient coil 820, X-gradient coil 830, and Y-gradient coil 840. The fluid outlets 814 of the central manifold 810 supply each of the Z-gradient coil 820, X-gradient coil 830, and Y-gradient coil 840. In the illustrated embodiment, the central manifold 810 includes fluid outlets 814 in fluid communication with the corresponding flow inlet 822 (for Z-gradient), flow inlet 832 (for X-gradient), and flow inlet 842 (for Y-gradient).

It may be noted that, in the illustrated embodiment, the example coil system 100 includes two Z-gradient coil portions 820a and 820b that are axially spaced apart, with each Z-gradient coil portion defining a generally cylindrical or helical shape. A gap 860 is defined between the Z-gradient coil portions 820a, 820b. The central manifold 810 (as well as the central manifold 810a and central manifold 810b of the illustrated embodiment) is disposed with the gap 860. Placement of the central manifold 810 with the gap 860 provides for convenient and efficient placement of the central manifold 810, allowing the central manifold 810 to occupy an already existing space instead of requiring adding to the size of the coil system 100 to accommodate the central manifold 810.

Figure 10:
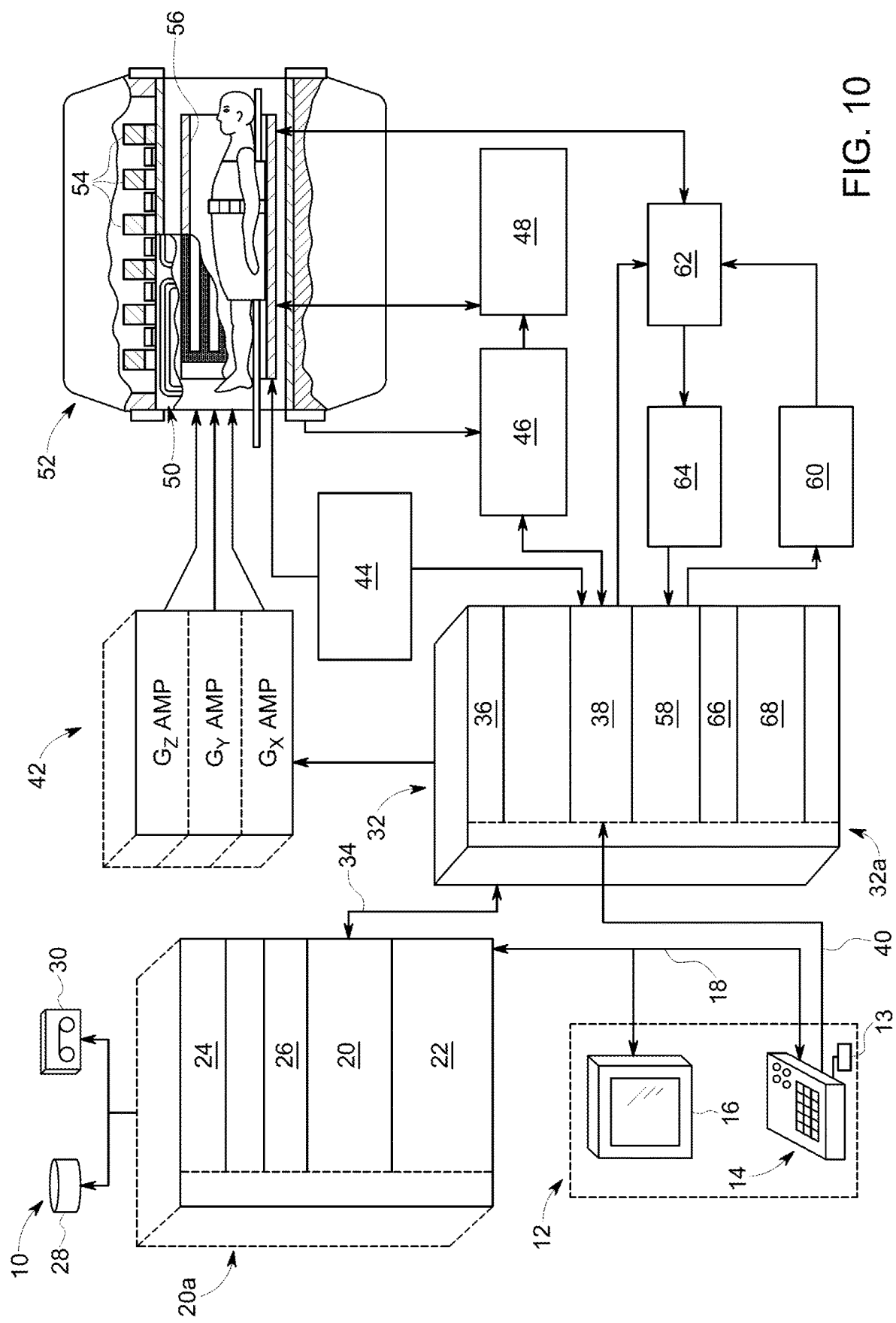
FIG. 10 provides a schematic block diagram of an Mill system in accordance with various embodiments.

As discussed herein various methods and/or systems (and/or aspects thereof) described herein may be implemented in connection with an MRI system. For example, FIG. 10 depicts various major components of an MRI system 10 formed in accordance with various embodiments. The operation of the system is controlled from an operator console 12 which includes a keyboard or other input device 13, a control panel 14, and a display 16. The console 12 communicated through a link 18 with a separate computer system 20 that enables an operator to control the production and display of images on the screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light want, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the san sequence that is to be performed. The pulse generator module 38 operates the system components to carry out the desired scan sequence and produce data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensor connected to the patient or subject, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 and RF shield (not shown) form a part of a magnet assembly 52 which includes a polarizing magnet 54 and a RF coil assembly 56. A transceiver module 58 in the system control 32 produces pulses which are amplified by an RF amplifier 60 and coupled to the RF coil assembly 56 by a transmit/receive switch 62. The resulting signals emitted by the excited nuclei in the patient may be sensed by the same RF coil assembly 56 or apportion thereof and coupled through transmit/receive switch 62 to a preamplifier 64. The amplified MR signals are demodulated, filtered, and digitized in the receive section of the transceiver 58. The transmit/receive switch 62 is controlled by a signal from the pulse generator module 38 to electrically connect the RF amplifier 60 to the coil assembly 56 during the transmit mode and to connect the preamplifier 64 to the coil assembly 56 during the receive mode. The transmit/receive switch 62 can also enable a separate RF coil (for example, a surface coil) to be used in either the transmit or receive mode. The magnet assembly 52 may be cooled cryogenically.

The MR signals picked up by the selected RF coil are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein. Instead, the use of "configured to" as used herein denotes structural adaptations or characteristics, and denotes structural requirements of any structure, limitation, or element that is described as being "configured to" perform the task or operation. For example, a processing unit, processor, or computer that is "configured to" perform a task or operation may be understood as being particularly structured to perform the task or operation (e.g., having one or more programs or instructions stored thereon or used in conjunction therewith tailored or intended to perform the task or operation, and/or having an arrangement of processing circuitry tailored or intended to perform the task or operation). For the purposes of clarity and the avoidance of doubt, a general purpose computer (which may become "configured to" perform the task or operation if appropriately programmed) is not "configured to" perform a task or operation unless or until specifically programmed or structurally modified to perform the task or operation.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f) unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal language of the claims.

What is claimed is:

1. A magnetic resonance imaging (MRI) coil system comprising:
   a gradient coil comprising a flow channel passing therethrough, the gradient coil defining an eye and an end; and
   a flow inlet disposed along the gradient coil between the eye and the end, wherein cooling fluid is provided to the gradient coil via the flow inlet, and removed from the gradient coil via the eye and the end, wherein the flow channel defines a first flow path from the flow inlet to the eye, and defines a second flow path from the flow inlet to the end.

2. The MRI coil system of claim 1, wherein the gradient coil includes a conductive shell disposed about and defining the flow channel.

3. The MRI coil system of claim 1, wherein the gradient coil includes a cooling tube defining the flow channel and conductive wire disposed about the cooling tube.

4. The MRI coil system of claim 1, wherein the gradient coil defines a length having an iso-center, and the flow inlet is disposed substantially at the iso-center.

5. The MRI coil system of claim 1, further comprising an inlet assembly coupled to the flow inlet, the inlet assembly having a first end configured to couple to the flow inlet and a second end configured to couple to a fluid supply line.

6. The MRI coil system of claim 5, wherein the first end couples to a hole extending through an exterior of the gradient coil.

7. The MRI coil system of claim 5, wherein the inlet assembly comprises a coil end portion and a supply end portion, the coil end portion extending perpendicularly from the supply end portion.

8. The MRI coil system of claim 1, further comprising a shield coil assembly disposed radially outward of the gradient coil, the shield coil assembly comprising a first shield coil and a second shield coil extending alongside each other and defining separate first and second field coil flow channels, respectively.

9. The MRI coil system of claim 1, further comprising a central manifold disposed axially inward of the end of the gradient coil, the central manifold comprising a manifold inlet to receive a fluid supply, and at least one fluid outlet in fluid communication with the flow inlet of the gradient coil.

10. The MRI coil system of claim 9, comprising plural central manifolds spaced radially about a bore of the coil system.

11. The MRI coil system of claim 9, comprising a Z-gradient coil, an X-gradient coil, and a Y-gradient coil, wherein the central manifold comprises fluid outlets in fluid communication with corresponding flow inlets of the Z-gradient coil, X-gradient coil, and Y-gradient coil.

12. The MRI coil system of claim 9, wherein the coil system includes 2 Z-gradient coil portions axially spaced apart and defining a gap therebetween, wherein the central manifold is disposed within the gap.

13. The MRI coil system of claim 9, further comprising at least one insulation break disposed along a supply line from at least one fluid outlet of the central manifold and the flow inlet of the gradient coil.

14. A magnetic resonance imaging (MRI) coil system comprising:
at least one gradient coil comprising a flow channel passing therethrough, the gradient coil defining an eye and an end, wherein the flow channel defines a first flow path from a flow inlet to the eye, and defines a second flow path from the inlet to the end, the flow inlet disposed along the coil between the eye and the end; and
a central manifold disposed axially inward of the end of the gradient coil, the central manifold comprising a manifold inlet to receive a fluid supply, and at least one fluid outlet in fluid communication with the flow channel of the gradient coil.

15. The MRI coil system of claim 14, wherein cooling fluid is provided to the gradient coil via the flow inlet, and removed from the gradient coil via the eye and the end, wherein the central manifold is in fluid communication with the flow inlet.

16. The MRI coil system of claim 14, comprising plural central manifolds spaced radially about a bore of the coil system.

17. The MRI coil system of claim 14, comprising a Z-gradient coil, an X-gradient coil, and a Y-gradient coil, wherein the central manifold comprises fluid outlets in fluid communication with corresponding flow inlets of the Z-gradient coil, X-gradient coil, and Y-gradient coil.

18. The MRI coil system of claim 9, wherein the coil system includes 2 Z-gradient coil portions axially spaced apart and defining a gap therebetween, wherein the central manifold is disposed within the gap.

19. The MRI coil system of claim 9, further comprising at least one insulation break disposed along a supply line from at least one fluid outlet of the central manifold and the gradient coil.

20. The MRI coil system of claim 9, further comprising a fluid splitter assembly configured to fluidly couple the fluid outlet with the flow channel.

* * * * *